(12) United States Patent
Crass (10) Patent No.: US 11,296,541 B2
(45) Date of Patent: Apr. 5, 2022

(54) POWER SUPPLY CONTINUITY SYSTEM

(71) Applicant: Snap-on Incorporated, Kenosha, WI (US)

(72) Inventor: Matthew M. Crass, Pleasant Prairie, WI (US)

(73) Assignee: Snap-on Incorporated, Kenosha, WI (US)

( * ) Notice: Subject to any disclaimer, the term of this patent is extended or adjusted under 35 U.S.C. 154(b) by 10 days.

(21) Appl. No.: 15/702,903

(22) Filed: Sep. 13, 2017

(65) Prior Publication Data

US 2019/0081504 A1    Mar. 14, 2019

(51) Int. Cl.
*H02J 9/06* (2006.01)
*G11C 5/14* (2006.01)
*H02J 1/10* (2006.01)

(52) U.S. Cl.
CPC .............. *H02J 9/06* (2013.01); *G11C 5/14* (2013.01); *H02J 1/10* (2013.01)

(58) Field of Classification Search
CPC ............. H02J 9/06; H02J 1/10; G11C 5/14
USPC .......................................................... 307/64
See application file for complete search history.

(56) References Cited

U.S. PATENT DOCUMENTS

| 4,982,612 A | 1/1991 | Rittmann |
| 5,130,700 A | 7/1992 | Annis et al. |
| 6,070,506 A | 6/2000 | Becker |
| 6,477,919 B1 | 11/2002 | Thomas et al. |
| 6,628,107 B1 * | 9/2003 | Bang ................. G06F 1/30 323/266 |
| 7,565,844 B2 | 7/2009 | Crass et al. |
| 8,400,013 B2 * | 3/2013 | Single ............. H01H 1/5866 307/42 |
| 9,067,309 B2 * | 6/2015 | McMenemy ....... B25B 21/00 |
| 2009/0284076 A1 | 11/2009 | Lin et al. |
| 2012/0167721 A1 * | 7/2012 | Fluhrer ............. B25B 21/00 81/54 |
| 2016/0279770 A1 | 9/2016 | Yokoyama et al. |
| 2016/0325391 A1 | 11/2016 | Stampfl et al. |

(Continued)

FOREIGN PATENT DOCUMENTS

| CN | 1913213 A | 2/2007 |
| CN | 103703651 | 4/2014 |
| CN | 102554890 | 3/2017 |

(Continued)

OTHER PUBLICATIONS

UK Combined Search and Examination Report for Application No. GB1810014.9, dated Nov. 30, 2018, 8 pages.

(Continued)

*Primary Examiner* — Carlos Amaya
(74) *Attorney, Agent, or Firm* — Seyfarth Shaw LLP (57) ABSTRACT

A power supply continuity system that maintains power continuity of a system, for example, a power tool. A reserve power supply, such as a capacitor, is operably coupled to a primary power supply in a parallel configuration to provide power to the system when the primary power supply is inoperable or disconnected. The reserve power supply can also be implemented in power regulation circuitry, for example, circuitry that controls the power output of the primary power supply, so that the reserve power supply can be included on a printed circuit board (PCB) and decrease costs of manufacturing.

10 Claims, 4 Drawing Sheets

(56) References Cited

U.S. PATENT DOCUMENTS

2018/0367874 A1* 12/2018 Stampfl ................ B23Q 17/00

FOREIGN PATENT DOCUMENTS

| DE | 102012202159 A1 | 8/2013 |
| EP | 2594369 | 5/2013 |
| JP | 2003048177 | 2/2003 |
| JP | 5432761 | 3/2014 |
| JP | 2016049577 A | 4/2016 |
| WO | 03043786 | 5/2003 |
| WO | 2012114749 | 8/2012 |
| WO | 2016179271 | 11/2016 |

OTHER PUBLICATIONS

Taiwan Office Action for Application No. 107132152, dated Mar. 29, 2019, 9 pages.
Canadian Office Action for Application No. 3,009,959, dated Apr. 24, 2019, 9 pages.
Australian Examination Report No. 1 for Application No. 2018204303, dated Jun. 14, 2019, 3 pages.
Examination Report No. 2 for corresponding AU application s/n 2018204303, dated Jun. 10, 2020.
Canadian Office Action for Application No. 3,009,959 dated Sep. 1, 2020, 4 pages.
Australian Examination Report No. 1 for Application No. 2020203996, dated Dec. 4, 2020, 4 pages.
Chinese Office Action for corresponding Chinese Application No. 201811058691.5 dated May 17, 2021, 7 pages.
Canadian Office Action for corresponding Canadian Application No. 3,009,959 dated Jun. 28, 2021, 3 pages.

* cited by examiner

POWER SUPPLY CONTINUITY SYSTEM

TECHNICAL FIELD OF THE INVENTION

The present invention relates generally to power supply continuity systems. More particularly, the present invention relates to a system for maintaining power supply continuity when a primary power supply is operatively disconnected from the system.

BACKGROUND OF THE INVENTION

Portable, removable power systems, for example batteries or power sources for power tools, include power supplies that sometimes become inadvertently separated from the system. For example, a power tool can have a battery that inadvertently disconnects from the tool when the tool is dropped or otherwise heavily impacted. Also, when a power supply is no longer able to supply sufficient power to the tool (e.g., when the power supply is discharged), the power supply must be replaced, thus requiring disconnection of the power supply. Any type of disconnection of the power supply from the tool causes power to cease being provided to the tool for a period of time, and often results in the tool being reset when a replacement or the same power supply is reconnected to the tool.

Power disconnection from a tool can be problematic because it can result in the deletion of data stored in volatile memory. For example, any user input settings made to the tool for operation (e.g., torque application limits), or stored prior tool application usage (e.g., amounts of torque already applied to a work piece), which are typically stored in a volatile memory within the tool, can be erased if the power supply is disconnected from the tool. This power disconnection may therefore require the user to re-input the settings for operation and either manually remember the prior tool application usage or, often, restart the torque application procedure from the beginning. Typically, user settings and tool usage information are stored in a volatile memory located inside the tool, where power disconnection from the tool (either purposely or accidentally) erases the data stored in the volatile memory. Power supply disconnection can, therefore, be problematic when a user of the tool has not saved the user settings or prior tool application usage information to a non-volatile memory, which would not be affected by power disconnection.

SUMMARY OF THE INVENTION

An embodiment of the present invention broadly includes a power supply continuity system that maintains a continuous supply of power to a tool while a primary power supply is disconnected from the tool. For example, an embodiment of the present invention comprises a system that includes a reserve power supply, such as a capacitor or smaller battery, disposed in a tool and operably coupled, in parallel, to the power supply. When the primary power supply is decoupled from the tool, the reserve power supply can temporarily provide stored power to the tool while the primary power supply is recoupled or replaced. The reserve power supply can also be operably coupled to the primary power supply in other ways, for example, by being operably coupled via a printed circuit board (PCB) with power regulation circuitry, so that manufacturing costs of implementing the power supply continuity system can be reduced. The reserve power supply can also be operably coupled to only the volatile memory of the tool to temporarily supply power in a more focused manner to reduce system reset or erasing of torque application information without inefficiently distributing reserve power to the other components of the tool.

Another embodiment of the present invention comprises a power continuity system including a primary power supply adapted to supply power to components and a reserve power supply operably coupled to the components and adapted to supply power to the components when the primary power supply is inoperable or disconnected.

Yet, another embodiment broadly includes a tool having a drive gear, a primary power supply adapted to supply power to the drive gear, and a reserve power supply, such as a capacitor, operably coupled to the drive gear and adapted to supply power to the drive gear when the primary power supply is inoperable or disconnected.

BRIEF DESCRIPTION OF THE DRAWINGS

For the purpose of facilitating an understanding of the invention, there are illustrated in the accompanying drawings embodiments thereof, from an inspection of which, when considered in connection with the following description, the invention, its construction and operation, and many of its advantages should be readily understood and appreciated.

DETAILED DESCRIPTION OF THE EMBODIMENTS

While the present invention is susceptible of embodiments in many different forms, there is shown in the drawings, and will herein be described in detail, embodiments of the invention, including a preferred embodiment, with the understanding that the present disclosure is to be considered as an exemplification of the principles of the invention and is not intended to limit the broad aspect of the invention to embodiments illustrated.

An embodiment of the present invention broadly comprises a power supply continuity system that ensures power is continuously supplied to internal components of the system even when a primary power supply is decoupled or disconnected from the system or otherwise inoperable. An embodiment of the present invention includes a reserve power supply, such as a capacitor or a battery, operably coupled to the primary power supply in parallel such that when the primary power supply is decoupled from the system or is otherwise inoperable (e.g., in a discharged state), the reserve power supply can temporarily provide stored power to the system. The reserve power supply can also be implemented in power regulation circuitry, for example, circuitry that controls the power output of the primary power supply. The reserve power supply can be implemented within the power regulation circuitry and can be operably coupled within a printed circuit board (PCB) so that the manufacturing costs of implementing the power supply continuity system can be reduced. It will be appreciated that the present invention is disclosed as being applicable for use with tools, however the present invention is not so limited and can be used anywhere where a continuous power supply is desired or advantageous.

Figure 1:
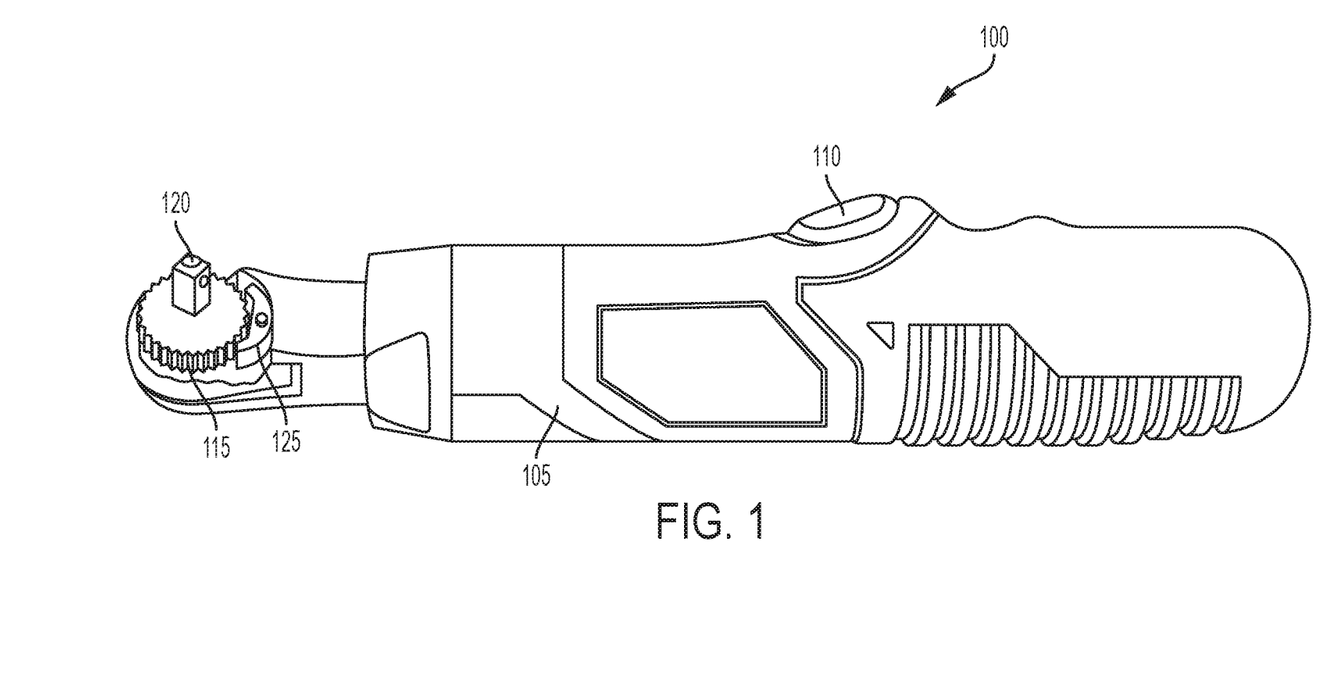
FIG. 1 is a side perspective view of a tool according to an embodiment of the present invention.

Referring to FIG. 1, a tool 100 can include a housing 105 having a cavity that houses internal operable components of the tool 100. An interface 110 can be coupled to the housing 105 to selectively operate the tool 100. For example, the interface 110 can be a button that, when pressed inwardly, causes the tool 100 to operate, such as apply torque to a work piece by powering an internal drive gear 115 that rotates an operably coupled drive lug 120 in a well-known means. The tool 100 can further include a pawl mechanism 125 that selectively allows rotational movement of the drive gear 115 in either of first and second opposing rotational directions in a well-known means.

Figure 2:
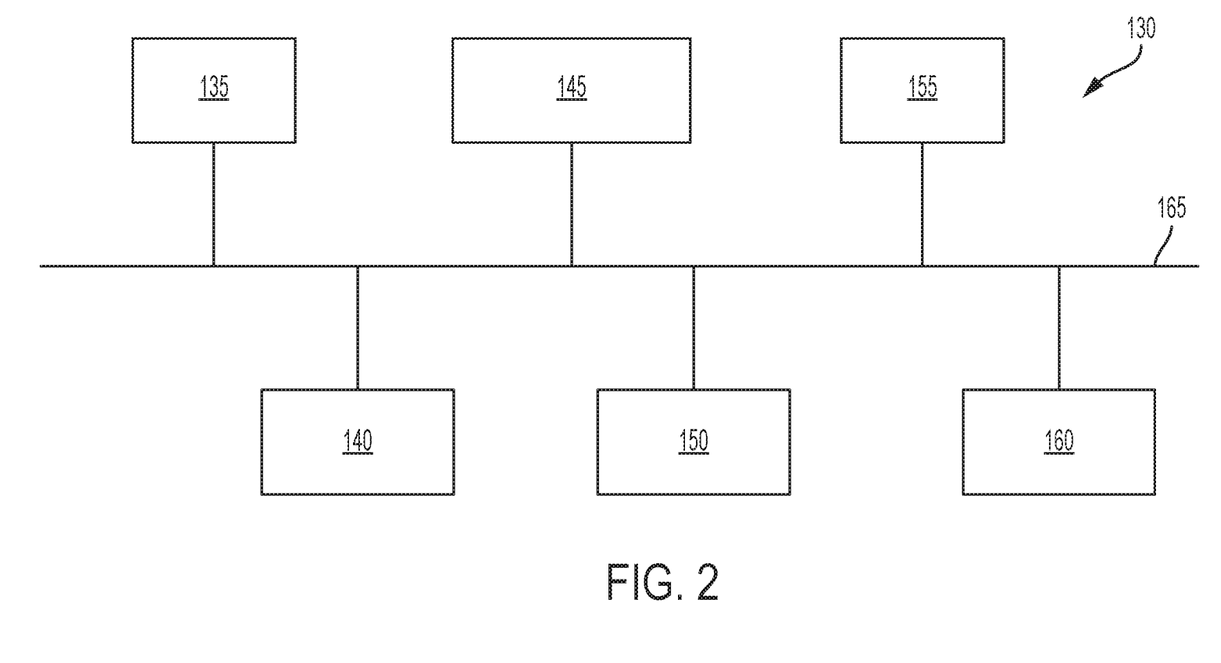
FIG. 2 is a schematic view of an internal system according to an embodiment of the present invention.

Referring to FIG. 2, the tool 100 can include an internal operational system 130 that includes various components that cooperatively function to provide operation to the tool 100. For example, an embodiment of the system 130 can include a primary power supply 135 adapted to supply power to the tool 100 for operation. The system 130 can further include power regulation circuitry 140 adapted to regulate voltage and/or amperage of power provided by the primary power supply 135, and a memory 145 adapted to store data. The system 130 can also include a display 150 for displaying information to a user, a processor 155 for carrying out processes of the system 130, and a transceiver 160 for communicating data to and from the tool 100. Each of the components 135, 140, 145, 150, 155, 160 can be operatively coupled together by a bus 165.

The interface 110 can be any structure or mechanism adapted to allow a user to selectively input commands to the tool 100. For example, the interface 110 can be a button that, when depressed inwardly, causes the drive gear 115 to be powered and, accordingly, causes the drive lug 120 to rotate and apply torque to a work piece. However, the interface 110 can be any other type of interface, for example, a touch screen, keyboard, lever, button, knob, trigger, or any other mechanism that allows for the selective provision of power from a power supply to another component.

The primary power supply 135 supplies electrical current to the tool 100 from either an independent or dependent power source. In an embodiment, the primary power supply 135 is a battery. However, the primary power supply 135 can be any component or devive that is capable of supplying power, such as a battery, fuel cell, engine, solar power system, wind power system, hydroelectric power system, a power cord for attachment to an electrical socket, or any other means of supplying power.

The power regulation circuitry 140 can be any circuitry or combination of circuitry that is operably coupled with the primary power supply 135 and regulates the amount of power distributed from the primary power supply 135 during usage, such as voltage and/or current. For example, the power regulation circuitry 140 can include a current, voltage, or power feedback circuitry that respectively measures the current, voltage, or power distributed to the tool 100 and, depending on the circumstance, causes a reduced or increased amount of current, voltage, or power to be delivered to the tool 100 from the primary power supply 135. The power regulation circuitry 140 can also include surge suppression circuitry, such as one or more diodes, to prevent excessive or otherwise damaging current, voltage, or power from being delivered from the primary power supply 135 to the tool 100. The power regulation circuitry 140 can also include one or more metal oxide field effect transistors (MOSFETs), for example, an H-bridge configuration, to allow the selective and gradual supply of power to the tool 100 from the primary power supply 135.

The power regulation circuitry 140 can also include a reserve power supply, for example a capacitor or a battery, operatively coupled to the primary power supply 135 and adapted to supply power to the tool 100 when the primary power supply 135 is operably decoupled from the tool 100. As discussed herein, the term "operably decoupled" means decoupled in such a manner that the primary power supply 135 cannot provide power to the tool 100. The term "operably decoupled" also means, in certain embodiments, when the primary power supply 135 is inoperable, such as in a discharged or low power state, and thus cannot supply sufficient amount of power to the tool 100 for operation, even though the primary power supply 135 is otherwise coupled to tool 100. In an embodiment, the power regulation circuitry 140 is included on or operably coupled with a printed circuit board for ease of manufacturing.

In an embodiment, memory 145 can be operably coupled to components of the tool 100 and can store information relating to operation of the tool 100, such as maximum or minimum torque application parameters, measured torque application values, torque cycles, angle cycles, and any other information relevant to the torque operation. By way of example, and not limitation, the memory 145 can be a non-transitory computer-readable recording medium, such as a hard drive, DVD, CD, flash drive, volatile or non-volatile memory, RAM, or any other type of data storage. As used throughout this application, the term "non-transitory computer-readable recording medium" excludes only signals and carrier waves, per se, and is not meant to exclude other types of memory that may be considered "transitory" such as RAM or other forms of volatile memory.

The memory 145 can further store any information relevant to the tool 100, such as an operating system of the tool 100 or details relating to the tool operation. For example, the tool 100 can measure the amount of torque applied by the tool 100 to work pieces during torqueing operations, and the memory 145 can store the measured amounts of torque. Similarly, the memory 145 can store predetermined torqueing operations that the tool 100 is to perform. The memory 145 can also store any user settings, such as preferences of the tool 100, tolerances for the measured amounts of torque, or any other setting. The display 150 can be any device that displays information to the user of the tool 100. By way of example, the display 150 can include a liquid crystal display (LCD), organic light emitting diode (OLED) display, plasma screen, cathode ray tube display, or any other kind of black and white or color display that will allow the user to view and interpret information on the tool 100.

The processor 155 facilitates communication between the various components of the tool 100. The processor 155 can be any type of processor or processors that alone or in combination facilitate electrical processes of the tool 100. For example, the processor 155 can be a desktop or mobile processor, a microprocessor, a single-core or a multi-core processor.

The transceiver 160 can be any device capable of transmitting data from the tool 100 or capable of receiving data from an external data source. By way of example, the transceiver 160 can be any type of radio transmission antenna, cellular antenna, hardwired transceiver, or any other type of wired or wireless transceiver capable of communicating with an external device.

The bus 165 acts as the electrical backbone of the tool 100 and connects the various components 135, 140, 145, 150, 155, 160 together. The bus 165 can be any structure, circuit, or software program that performs such a function.

Figure 3:
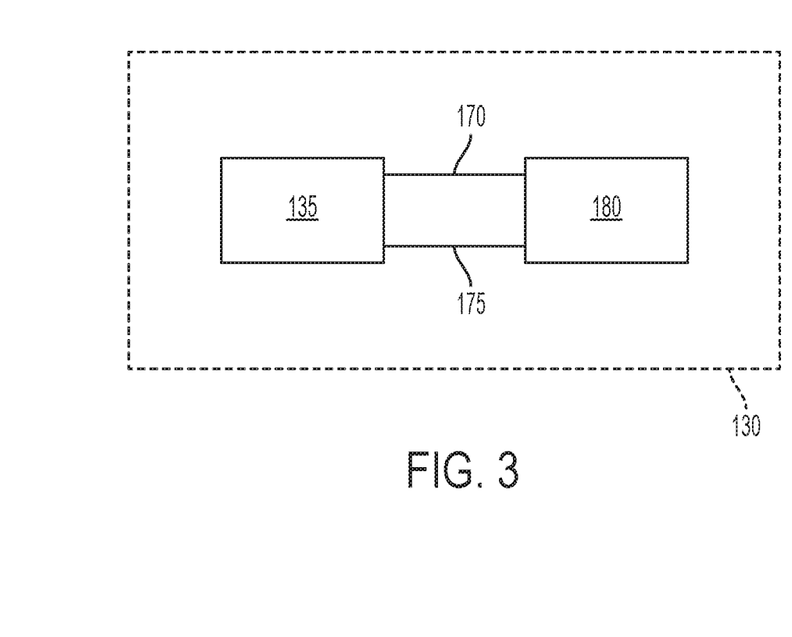
FIG. 3 is another schematic diagram of an internal system according to an embodiment of the present invention.

Referring to FIG. 3, an embodiment of the power continuity system of the present invention includes a capacitor coupled to a battery, for example. The internal system 130 can include first and second leads 170, 175 extending from the primary power supply 135. For example, the first lead 170 can extend from a positive terminal of a battery, and the second lead 175 can extend from a negative terminal of the battery. The first and second leads 170, 175 can couple to a reserve power supply 180, for example, a capacitor, in a parallel configuration. That is, in some embodiments, the first and second leads 170, 175 can be coupled directly from a primary power supply 135 to a reserve power supply 180 in a parallel configuration.

The reserve power supply 180 can be any component able to temporarily supply power to the tool 100 or to any individual component of the tool 100 while the primary power supply 135 is operably decoupled from the tool 100. For example, the reserve power supply 180 can be a capacitor, or like the primary power supply 135, can be a battery, fuel cell, engine, solar power system, wind power system, hydroelectric power system, a power cord for attachment to an electrical socket, or any other means of providing power. In addition, the primary power supply 135 and the reserve power supply 180 need not be the same type of power supply. For example, in an embodiment, the primary power supply 135 can be a battery and the reserve power supply 180 can be a capacitor. In an embodiment, the reserve power supply 180 is intended to be used to only supply sufficient power to critical tool components, such as volatile memory 145, while the primary power supply 135 is operably decoupled from the tool 100. In such an embodiment, the size and capacity of the reserve power supply 180 is sufficiently small enough to not noticeably affect the overall size or weight of the tool 100.

It will be appreciated that the memory 145 is an important component because, when a user drops the tool 100 or otherwise causes the primary power supply 135 to be operatively decoupled from the tool 100, the memory 145, in some embodiments being volatile, can lose power and erase any data stored in volatile memory. Many presets, torqueing application data, preferences, settings, and other information stored in the volatile memory will thus be lost. Accordingly, in some embodiments, the primary power supply 135 is operatively coupled to the tool 100 to provide main power to a plurality of components of the tool 100 for normal operation of the tool 100, and the reserve power supply 180 is operatively coupled to only the memory 145 so the data in the memory 145 is not erased when the primary power supply 135 is operably decoupled from the tool 100. In an embodiment, the reserve power supply 180 can temporarily supply power to the entire tool 100 when the primary power supply 135 is operably decoupled from the tool 100.

Figure 4:
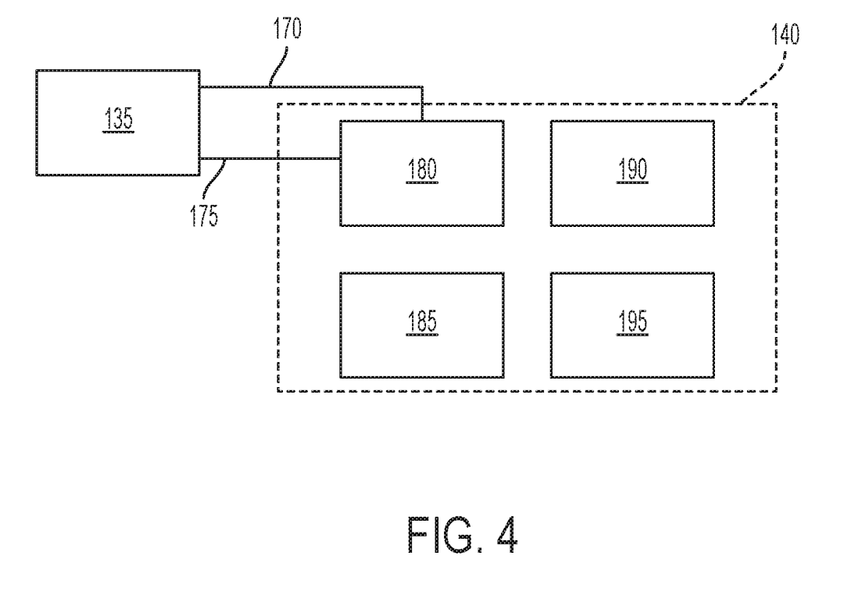
FIG. 4 is a schematic view of a power supply regulation system according to an embodiment of the present invention.

Referring to FIG. 4, another embodiment of the present invention includes a reserve power supply 180 implemented within power regulation circuitry 140. As shown, and as discussed above, the power regulation circuitry 140 can include the reserve power supply 180 implemented within the power regulation circuitry 140, rather than being a component external to the power regulation circuitry 140. Further, the power regulation circuitry 140 can include power distribution circuitry 185, for example one or more MOSFETs arranged as, for example, an H-bridge, for selectively and gradually delivering power to the tool 100. The power regulation circuitry 140 can also include feedback circuitry 190 for providing electrical feedback information and regulating the primary power supply 135 based on the electrical feedback information, and also power suppression circuitry 195, such as one or more diodes, for preventing excessive amounts of voltage or current from being delivered to the tool 100 by the primary power supply 135. Any other form of power regulation circuitry can be implemented within the power regulation circuitry 140 without departing from the spirit and scope of the present application.

The power regulation circuitry 140 can be included on a PCB and, as such, can be quickly and cheaply manufactured. Also, the reserve power supply 180 can be coupled to the power supply 135 on the printed circuit board with the power regulation circuitry 140 in any manner that allows the reserve power supply 180 to temporarily supply power to the tool 100 when the primary power supply 135 is operably decoupled from the tool 100. For example, the reserve power supply 180 can be a capacitor operatively coupled to a PCB and adapted to supply power to either the memory 145 or any other one or more components of the tool 100. This structure allows a compact and inexpensive implementation of the power continuity system because the reserve power supply 180 can be implemented on the PCB and, as such, can be easily manufactured. The reserve power supply 180 can be operably coupled to the primary power supply 135 in parallel or otherwise when implemented on the PCB so long as the reserve power supply 180 is adapted to supply power to the tool 100 when the primary power supply 135 is operably decoupled from the tool 100.

As discussed above, the tool 100 can be a torque wrench adapted to apply torque to a work piece, such as a bolt or nut. However, the tool 100 can be any tool 100 that is powered by a power supply, for example, a drill, screwdriver, hammer, impact wrench, saw, or any other power tool. Also, the tool 100 need not be a tool at all, and can instead be any device capable of being powered by an internal or external power source.

As used herein, the term "coupled" and its functional equivalents are not intended to necessarily be limited to a direct, mechanical coupling of two or more components. Instead, the term "coupled" and its functional equivalents are intended to mean any direct or indirect mechanical, electrical, or chemical connection between two or more objects, features, work pieces, and/or environmental matter. "Coupled" is also intended to mean, in some examples, one object being integral with another object.

The matter set forth in the foregoing description and accompanying drawings is offered by way of illustration only and not as a limitation. While particular embodiments have been shown and/or described, it will be apparent to those skilled in the art that changes and modifications may be made without departing from the broader aspects of the invention. The actual scope of the protection sought is intended to be defined in the following claims when viewed in their proper perspective.

What is claimed is:

1. A power continuity system for a tool having components including a volatile memory, comprising:
　　a primary power supply including first and second leads and adapted to supply power to the components; and
　　a reserve power supply disposed on a printed circuit board (PCB) with power regulation circuitry adapted to regulate power provided by the primary power supply to the components and operatively coupled to the first and second leads of the primary power supply in a parallel configuration, wherein the reserve power supply is adapted to supply power to only the volatile memory when the primary power supply is unable to provide sufficient power to the volatile memory.

2. The power continuity system of claim 1, wherein the reserve power supply is a capacitor.

3. The power continuity system of claim 1, wherein the power regulation circuitry is one of a power distribution circuitry, feedback circuitry, or power suppression circuitry.

4. A tool comprising:
- components including a motor and a drive gear, and a volatile memory;
- a primary power supply including first and second leads, operatively coupled to the components and adapted to supply power to each of the components; and
- a capacitor disposed on a printed circuit board (PCB) with power regulation circuitry adapted to regulate power provided by the primary power supply to the components of the tool and operatively coupled to the first and second leads of the power supply in a parallel configuration, wherein the capacitor is adapted to supply power to only the volatile memory when the primary power supply is unable to provide sufficient power to the volatile memory.

5. The tool of claim 4, wherein the power regulation circuitry is one of power distribution circuitry, feedback circuitry, and power suppression circuitry.

6. A tool having a drive gear adapted to be coupled to and apply an amount of torque to a work piece and a volatile memory for storing information relating to the amount of torque applied to the work piece, the tool comprising:
- a primary power supply including first and second leads, the primary power supply operatively coupled to and adapted to supply power to the drive gear for operation of the drive gear and operatively coupled to and adapted to supply power to the volatile memory; and
- a reserve power supply disposed on a printed circuit board (PCB) with power regulation circuitry adapted to regulate power provided by the primary power supply to the components of the tool, operatively coupled to the first and second leads of the primary power supply in a parallel configuration, and operatively coupled to the volatile memory, wherein the reserve power supply is adapted to supply sufficient power to only the volatile memory when the primary power supply cannot supply power to the volatile memory.

7. The tool of claim 1, wherein the tool is a wrench including:
- a drive gear adapted to be coupled to a drive lug;
- a pawl adapted to selectively allow the drive gear to rotate in first or second directions;
- a cavity that houses at least the components, the reserve power supply, and the power regulation circuitry; and
- an interface coupled to the housing and that is adapted to cause the tool to operate.

8. The tool of claim 1, wherein the primary power supply is an external power source that supplies power via a power cord.

9. The tool of claim 4, wherein the power regulation circuitry includes one or more MOSFETs arranged as an H-bridge and is adapted to selectively provide power to the motor.

10. A power continuity system for a tool comprising:
- a primary power supply including first and second leads and adapted to supply power to components of the tool; and
- a reserve power supply implemented within power regulation circuitry adapted to regulate power provided by the primary power supply to the components of the tool, and further operatively coupled to the first and second leads of the primary power supply in a parallel configuration, wherein the reserve power supply is adapted to supply power to only a memory of the components when the primary power supply is unable to provide sufficient power to the memory.

* * * * *

UNITED STATES PATENT AND TRADEMARK OFFICE
CERTIFICATE OF CORRECTION

PATENT NO. : 11,296,541 B2  
APPLICATION NO. : 15/702903  
DATED : April 5, 2022  
INVENTOR(S) : Matthew Crass Page 1 of 1

It is certified that error appears in the above-identified patent and that said Letters Patent is hereby corrected as shown below:

In the Claims

In Column 8, in Claim 7, Line 8, change "The tool of claim 1" to "The tool of claim 4"

In Column 8, in Claim 7, Line 10, change "a drive gear" to "the drive gear"

In Column 8, in Claim 8, Line 17, change "The tool of claim 1" to "The tool of claim 4"

Signed and Sealed this  
Twenty-fifth Day of July, 2023

Katherine Kelly Vidal  
*Director of the United States Patent and Trademark Office*